United States Patent
Carignan et al.

(10) Patent No.: US 11,800,640 B1
(45) Date of Patent: Oct. 24, 2023

(54) PRINTED CIRCUIT BOARD DIELECTRIC MOLDING AND ELECTROLYTIC METALLIZATION

(71) Applicant: INFINITUM ELECTRIC, INC., Round Rock, TX (US)

(72) Inventors: Edward C. Carignan, Round Rock, TX (US); Paulo Guedes-Pinto, Round Rock, TX (US)

(73) Assignee: INFINITUM ELECTRIC, INC., Round Rock, TX (US)

( * ) Notice: Subject to any disclaimer, the term of this patent is extended or adjusted under 35 U.S.C. 154(b) by 0 days.

(21) Appl. No.: 18/127,453

(22) Filed: Mar. 28, 2023

(51) Int. Cl.
| | |
|---|---|
| H02K 1/02 | (2006.01) |
| H05K 1/02 | (2006.01) |
| H05K 1/03 | (2006.01) |
| H02K 3/26 | (2006.01) |
| H05K 3/18 | (2006.01) |

(52) U.S. Cl.
CPC .......... H05K 1/0284 (2013.01); H02K 3/26 (2013.01); H05K 1/0366 (2013.01); H05K 3/18 (2013.01); H05K 2201/09036 (2013.01)

(58) Field of Classification Search
CPC .......... H02K 3/26; H05K 1/02; H05K 1/0284; H05K 1/03; H05K 1/0366; H05K 2201/09036; H05K 3/18
USPC ......... 310/49.42, 156.32, 208, 209, 216.001, 310/216.002
See application file for complete search history.

(56) References Cited

U.S. PATENT DOCUMENTS

| | | | | |
|---|---|---|---|---|
| 3,230,406 A | * | 1/1966 | Henry-Baudot | H02K 21/24 310/155 |
| 6,411,002 B1 | * | 6/2002 | Smith | H02K 3/47 310/156.01 |
| 6,426,241 B1 | * | 7/2002 | Cordes | H01L 21/4857 438/126 |
| 8,193,781 B2 | * | 6/2012 | Lin | H02K 35/02 336/200 |
| 8,240,036 B2 | * | 8/2012 | Yoshioka | H05K 3/4661 29/830 |
| 8,736,133 B1 | * | 5/2014 | Smith | H02K 21/24 310/208 |

(Continued)

FOREIGN PATENT DOCUMENTS

JP     2004281427     10/2004

OTHER PUBLICATIONS

Yamada et al, English Machine Translation of JP2004-281427 (Year: 2004).*

Primary Examiner — Rashad H Johnson
(74) Attorney, Agent, or Firm — DICKINSON WRIGHT PLLC

(57) ABSTRACT

A printed circuit board (PCB) has a tridimensional (3D) dielectric substrate having opposite sides and made of fiber-reinforced polymer. Each side comprises channels and pockets formed by molding a dielectric laminate, and the channels and pockets define a layout for conductive traces and pads of the PCB. The channels and pockets in a same side of the 3D dielectric substrate have a uniform depth. Side walls of the channels and pockets have a draft angle in a range of greater than 0 degrees to about 5 degrees. The conductive traces and pads are formed into the channels and pockets by electrolytic metallization. In addition, the outer surface of conductive traces and pads are flush with the sides of the 3D dielectric substrate.

21 Claims, 11 Drawing Sheets

(56) References Cited

U.S. PATENT DOCUMENTS

| | | | | |
|---|---|---|---|---|
| 8,785,784 B1* | 7/2014 | Duford | ............... | H05K 1/165 |
| | | | | 174/262 |
| 9,072,187 B2* | 6/2015 | Hu | ............... | H05K 3/10 |
| 9,332,650 B2 | 5/2016 | Yoshioka et al. | | |
| 10,135,310 B2* | 11/2018 | Schuler | ............... | H02K 3/521 |
| 10,186,922 B2* | 1/2019 | Schuler | ............... | H02K 11/30 |
| 10,819,174 B2* | 10/2020 | Schuler | ............... | H02K 16/00 |
| 11,336,130 B1* | 5/2022 | Shaw | ............... | H02K 3/26 |
| 11,502,583 B1* | 11/2022 | Lee | ............... | H02K 1/2798 |
| 11,616,423 B1* | 3/2023 | Lee | ............... | H02K 3/26 |
| | | | | 310/194 |
| 2006/0202584 A1* | 9/2006 | Jore | ............... | H02K 11/215 |
| | | | | 310/179 |
| 2016/0329796 A1* | 11/2016 | Hano | ............... | H02K 21/24 |
| 2018/0219445 A1* | 8/2018 | Jore | ............... | H02K 1/12 |

\* cited by examiner

SECTION A-A

SECTION A-A

PRINTED CIRCUIT BOARD DIELECTRIC MOLDING AND ELECTROLYTIC METALLIZATION

BACKGROUND OF THE INVENTION

Field of the Disclosure

The present disclosure relates in general to an additive system, method and apparatus for printed circuit board (PCB) construction, in particular, where PCB traces are designed to carry large electrical currents, and further relates to PCB structures designed to operate as stators in electric motors.

Description of the Prior Art

A PCB typically can comprise one or more layers of a foil made of copper or other electrically conductive material, such as aluminum laminated onto a sheet of a dielectric material made of a fiber-reinforced polymer, such as a NEMA FR-4 woven fiberglass cloth with epoxy resin binder laminate. The electrically conductive layer can be laminated on one or both sides of the dielectric (e.g., FR-4) sheet. The most common conductive material used in PCB construction is copper foil, which can have electrical conductivity of 58 mS/m at 20° C., and its thickness is expressed in ounces of copper per square foot, being 1 oz/ft$^2$ copper the most common copper foil employed in PCB construction. The 1 oz/ft$^2$ copper foil has a thickness of about 35 µm. The PCB can have a plurality of conductive pads that are interconnected by a plurality of traces. Both pads and traces can be formed by etching the conductive material through a conventional photo-lithography process 100 depicted in FIG. 1, which includes steps 101-129.

In some embodiments, portions of a circuit formed in the PCB can carry high electric currents (e.g., several to tens of amperes). In those cases, the PCB can be made of thicker conductive foil. The commonly commercially available copper foils for PCBs are 2, 3 and 4 oz/ft$^2$, which have thicknesses of 70, 105 and 140 µm, respectively. In other embodiments, in addition to employing thicker foil, the PCB can have multiple layers configured to receive high electric currents that can flow in parallel layers and/or parallel traces. Examples of PCB structures that require high electric current carrying capability are PCB stators employed in axial field rotary energy devices similar to the devices described in U.S. Pat. Nos. 10,141,803, 10,135,310, 10,340,760, 10,141,804, 10,186,922, and 11,502,583, each of which is incorporated herein by reference in its entirety. Some of these PCB stator embodiments can have a plurality of conductive layers and conductive traces configured to carry high electric currents, as shown in FIG. 2, which shows a partial sectional view of a PCB structure 200 with a plurality of traces 201.

The conventional PCB manufacturing process depicted in FIG. 1 presents some disadvantages. First, the etching step 105 of the process 100 does not produce traces with a uniform cross section. FIG. 3 shows a magnified view of two conventional, adjacent traces 201 after the etching step 105 (FIG. 1). In FIG. 3, it can be seen that the width A of the base of the trace is wider than the width B at the top of the trace. The distance between adjacent traces C has a minimum value, called space, based on the voltage applied to the PCB. While the distance C can meet the minimum space requirement, it can be seen that the distance D at the top of the trace exceeds the minimum clearance value. The tapered profile at the side walls of the trace can be controlled to some extent by adjusting etching parameters, however it may be difficult to eliminate in its entirety. In PCB manufacturing, an "etch factor" is defined as the ratio W/T where W=(A−B)/2 and T is the thickness of the conductive trace. This etch factor is typically between 0.3 and 0.5. The result of the etching process is that the volume 202, which is the difference between a maximum theoretical rectangular trace shown as a dotted line and the actual trace cross section, is lost resulting in a smaller cross section available to current carrying, which can lead to higher resistance and a less efficient electrical circuit.

A second disadvantage of the conventional PCB manufacturing process 100 depicted in FIG. 1 is that, in some steps of the process, such as step 101 (pre-clean), step 108 (oxide coat), and step 111 (through hole metallization) for example, some conductive material can be removed, resulting in further reduction of the sectional area of traces 201.

A third disadvantage of the conventional PCB manufacturing process 100 depicted in FIG. 1 is that conductive material is removed from the PCB conductive layers. Although most of the conductive material can be recovered, the chemical processes required to recover conductive material employ hazardous chemicals and are energy intensive.

Finally, some PCB structures, particularly the PCB stators mentioned previously, require multiple layers of conductive material, so steps 101 to 119 must be repeated several times and the resulting laminates must be stacked together forming a multiple layer structure as shown in FIG. 2. In the conventional multiple layer PCB structure 200 shown in FIG. 2, it can be seen that dielectric layers 205, typically comprising a B-stage glass epoxy laminate such as a NEMA FR-4 prepreg, are stacked between some conductive layers formed by traces 201. The main purpose of layers 205 is to bond conductive layers together and fill the spaces 206 between adjacent traces 201. These layers 205 add to the overall thickness of the PCB structure hindering thermal dissipation, because they are usually poor thermal conductors.

Additive methods to manufacture PCB structures have been proposed in the past with different shortcomings. Cordes et al. in U.S. Pat. No. 6,426,241 proposes a method where channels and pockets in a tridimensional (3D) dielectric substrate are filled with a molten conductive material. That process requires a conductive material with a low melting point, such as tin-based solder alloys, for example, which makes the method unsuitable for high current applications (e.g., several to tens of amperes) as the typical conductivity of solder alloys is 10 times lower than copper. Furthermore, that process allows for filling channels and pockets on only one side of a 3D dielectric substrate.

Yoshioka et al. in U.S. Pat. Nos. 8,240.036 and 9,332,650 teaches a method where channels and pockets are formed on a dielectric substrate with a swellable resin film. That process requires the conductive material to be deposited through electroless plating, which limits the thickness of the conductive material to 2.5 µm or less. That makes it unsuitable for high current applications (e.g., several to tens of amperes) where the conductive material thickness can be 105 µm or more. Furthermore, that method allows for creating channels and pockets on only one side of a 3D dielectric substrate.

Yamada et al. in Japanese Pat. JP2004281427 proposes a method of forming a 3D conductive structure where a conductive material is deposited by electroless plating on some surfaces of a channel in a 3D dielectric structure. That method also is unsuitable for high current applications (e.g., several to tens of amperes) because the thickness of the conductive material is limited to 2.5 μm or less.

Hu in U.S. Pat. No. 9,072,187 teaches a method of forming a 3D conductive structure on a 3D dielectric substrate with channels with different depths where conductive lines (or traces) are offset from each other. This solution also is unsuitable for high current applications (e.g., several to tens of amperes) because it does not use the full depth of some channels to form conductive traces, therefore not minimizing the resistance of the conductive traces. Based on those previously disclosed solutions, improvements in PCB manufacturing continue to be of interest, particularly for circuits intended to carry high currents.

SUMMARY OF THE INVENTION

Embodiments of PCBs and molding and electrolytic metallization processes for PCBs are disclosed. For example, a product and process for manufacturing PCB structures whereby a dielectric material made of a fiber-reinforced polymer, such as NEMA FR-4 glass-epoxy laminate, is configured into a tridimensional (3D) dielectric substrate with channels and pockets that can be filled with a conductive material, such as copper by electrolytic metallization, for example. This can form conductive layers with a specific thickness according to the requirements of the PCB design, such as 140 μm or more, for example. This solution is not restricted by the commercial availability of conductive foils, such as 1, 2, 3 or 4 oz/ft² copper foil. After the conductive material is deposited on the 3D dielectric substrate by electrolytic metallization, for example, it can be laminated into a multiple layer PCB structure as required by the PCB design.

In addition, some embodiments enable the use of only the amount of conductive material necessary to form the conductive layers of the PCB structure with minimum waste or need to recover excess material. PCB structures can have one or more conductive layers. Hereinafter, a conductive layer with its respective dielectric substrate or a dielectric substrate with conductive layers on both sides will be referred to as a "PCB panel" or simply "panel".

DETAILED DESCRIPTION OF THE INVENTION

Referring to FIGS. 1-15, embodiments of a printed circuit board (PCB) can be built for several purposes including those that require high current circuits (e.g.: several to tens of amperes) such as DC/DC, DC/AC, AC/DC or AC/AC power converters. AC/AC converters can be used to convert AC power, typically provided at frequencies such as 60 or 50 Hz, to AC power at a frequency suitable to operate an electric motor, for example. Other PCB structures can be configured to operate as a stator for an axial field rotary energy device, which can be similar to the devices described in U.S. Pat. Nos. 10,141,803, 10,135,310, 10,340,760, 10,141,804, 10,186,922 and 11,502,583, each of which is incorporated herein by reference in its entirety.

Figure 1:
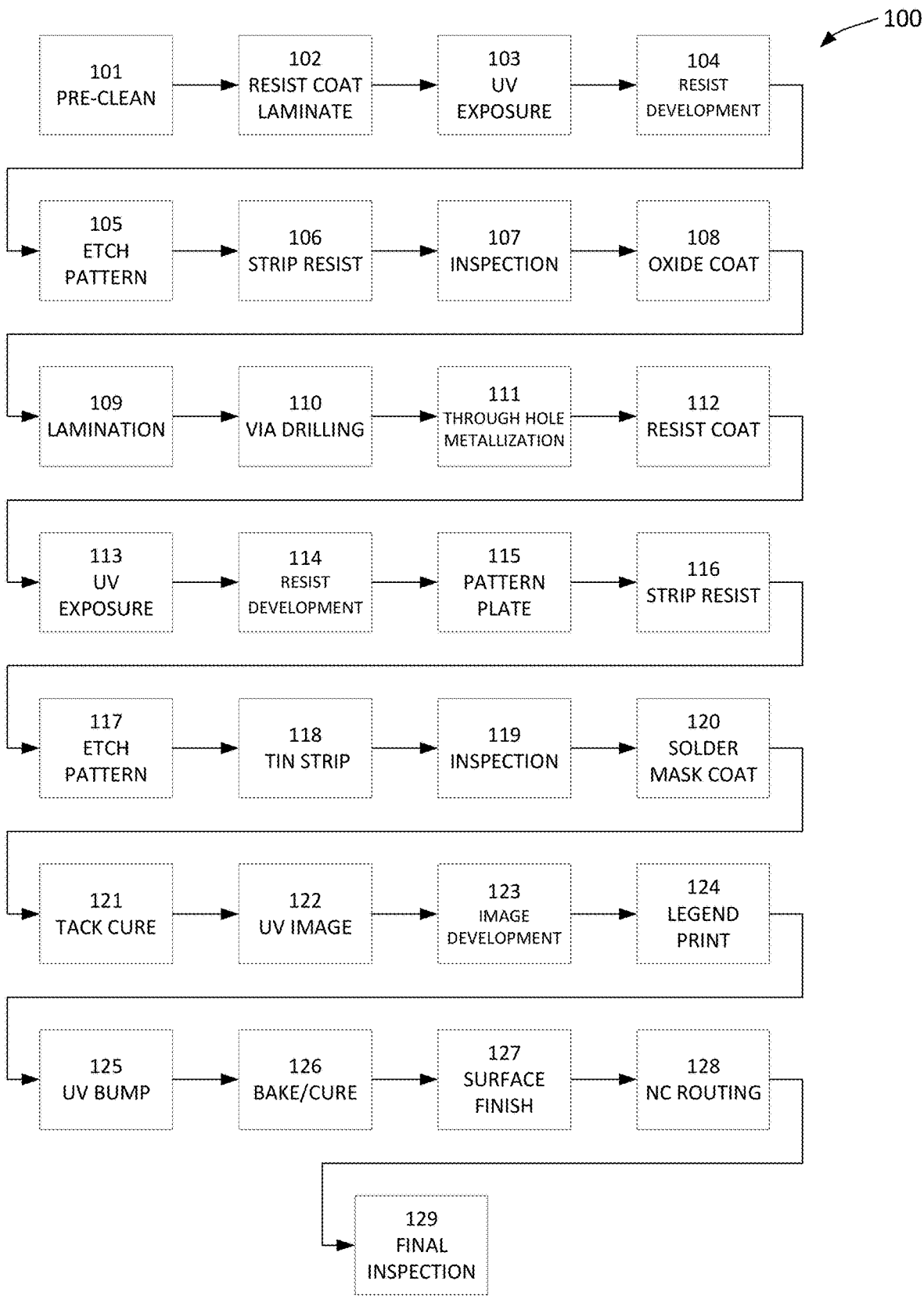
FIG. 1 is a process flow chart for a conventional PCB manufacturing process.
Figure 2:
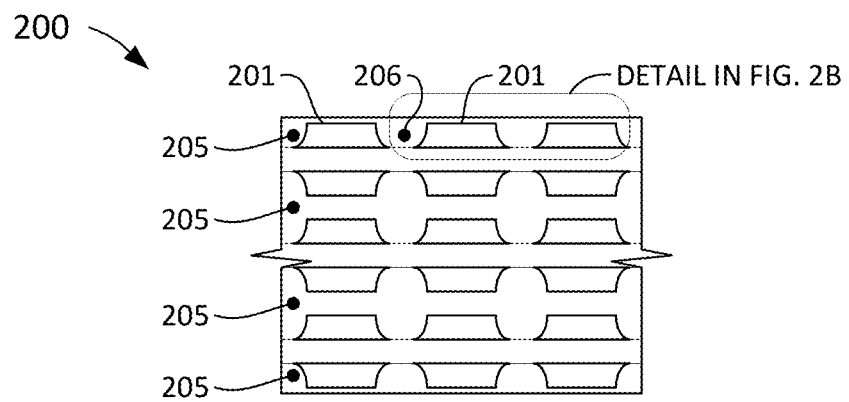
FIG. 2 is a sectional view of a conventional PCB structure with multiple layers.
Figure 3:
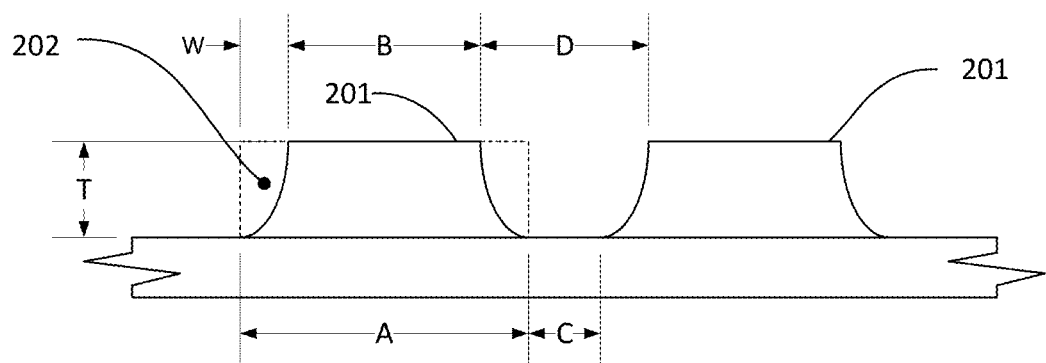
FIG. 3 is an enlarged sectional view of a portion of the conventional PCB structure shown in FIG. 2.
Figure 4:
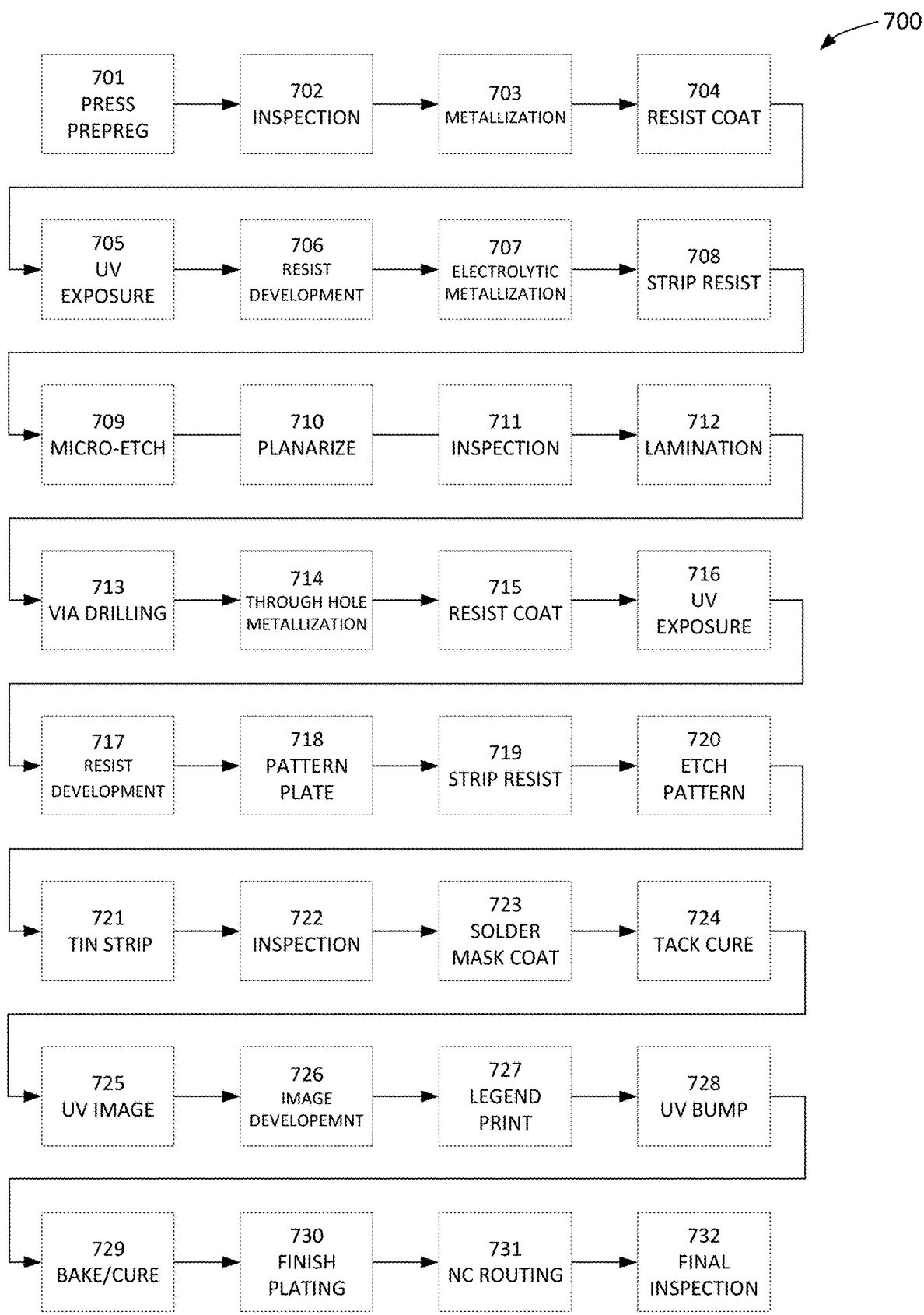
FIG. 4 is a process flow chart of an embodiment of a process for manufacturing a PCB structure using molded and plated 3D dielectric substrates.
Figure 5A:
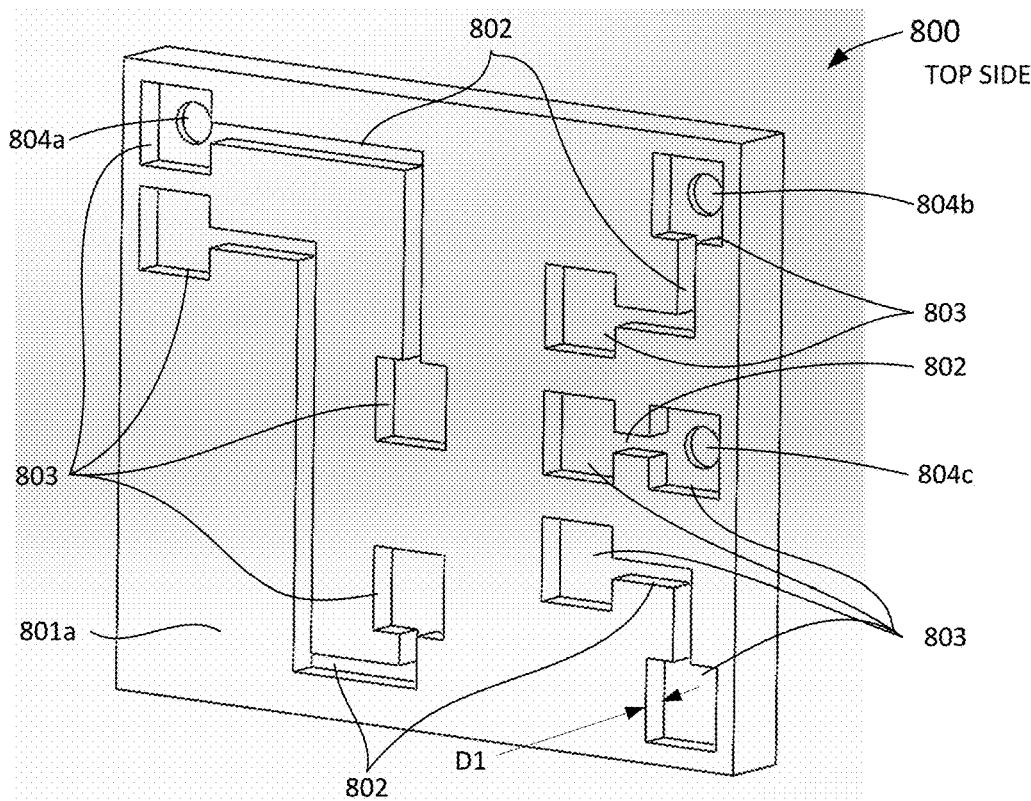
FIG. 5A is a perspective view of an embodiment of a top side of a 3D dielectric substrate.
Figure 5B:
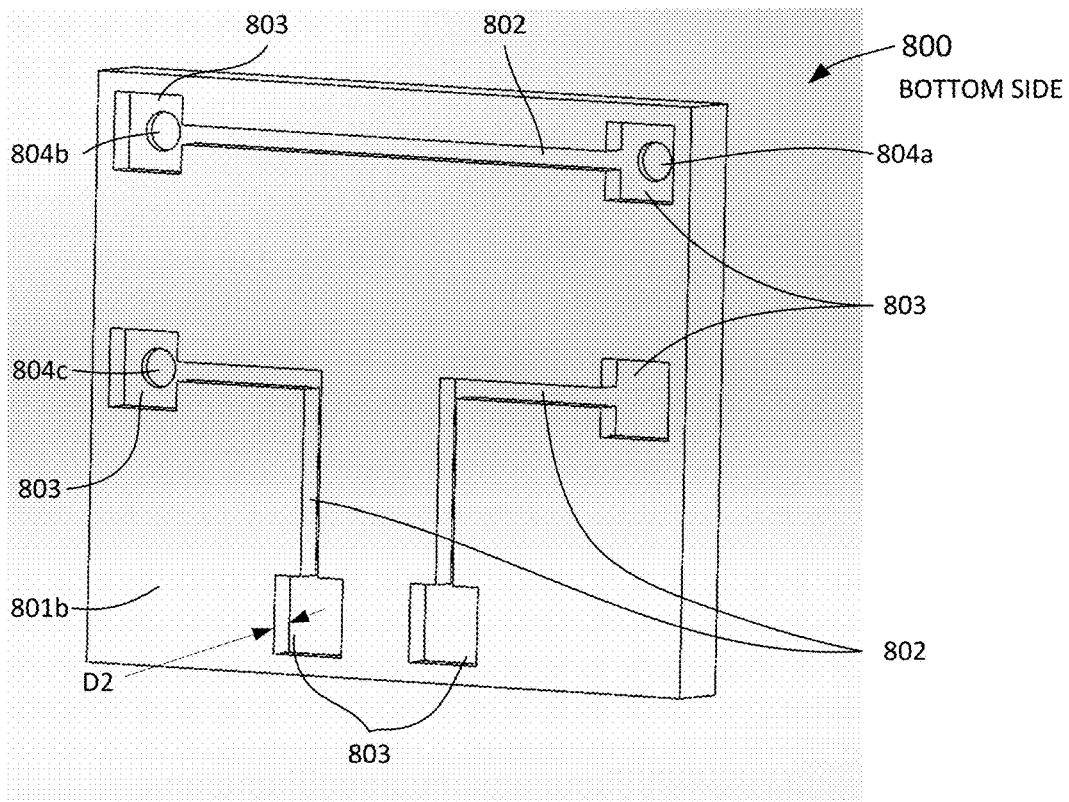
FIG. 5B is a perspective view of an embodiment of a bottom side of a 3D dielectric substrate.

An embodiment of a PCB manufacturing process 700 is described in FIG. 4, where in step 701, a B-stage dielectric material made of a fiber-reinforced polymer, such as NEMA FR-4 glass epoxy laminate, for example, is molded to form a three-dimensional (3D) dielectric substrate 800 as shown in FIGS. 5A and 5B. The 3D dielectric substrate 800 comprises a first side 801a and a second side 801b opposite to side 801a, and sides 801a and 801b can be substantially flat and parallel to each other. The side 801a can have a layout of channels 802 and pockets 803, hereinafter referred to as "top side", with a depth "D1" (FIG. 5A) that is the same or substantially the same as the thickness "T1" (FIG. 7B) of the conductive traces and pads of the PCB panel 1000. The side 801b can have a layout of channels 802 and pockets 803, hereinafter referred to as "bottom side", with a depth "D2" (FIG. 5B) that is the same or substantially the same as the thickness "T2" (FIG. 7B) of the conductive traces and pads of the PCB panel. In some embodiments the depths "D1" and "D2", and corresponding thicknesses "T1" and "T2", can be the same or within 25 μm of each other, for example, and in others "D1" and "D2" can be different. Although FIGS. 5A and 5B depict an embodiment of a 3D dielectric substrate 800 with two sides (e.g., top and bottom sides) and each side has a different layout, it should be understood that other embodiments of the 3D dielectric substrate 800 can have two sides with identical layouts, and others may have only one side.

In addition, the 3D dielectric substrate 800 can have openings 804a, 804b and 804c, hereinafter collectively referred to as "openings 804", to connect the two sides of the 3D dielectric substrate 800. In addition to a NEMA FR-4 glass epoxy laminate, the 3D dielectric substrate 800 can also be formed from other fiber-reinforced polymers, such as a glass-reinforced polyimide laminate, or ceramic-reinforced polytetrafluorethylene resin based laminate, for example, to impart mechanical rigidity to the 3D dielectric substrate. While the 3D dielectric substrate 800 shown in FIGS. 5A and 5B has three openings 804a-c to connect its two sides, other embodiments can have a different number of openings 804, or no openings at all.

Figure 6A:
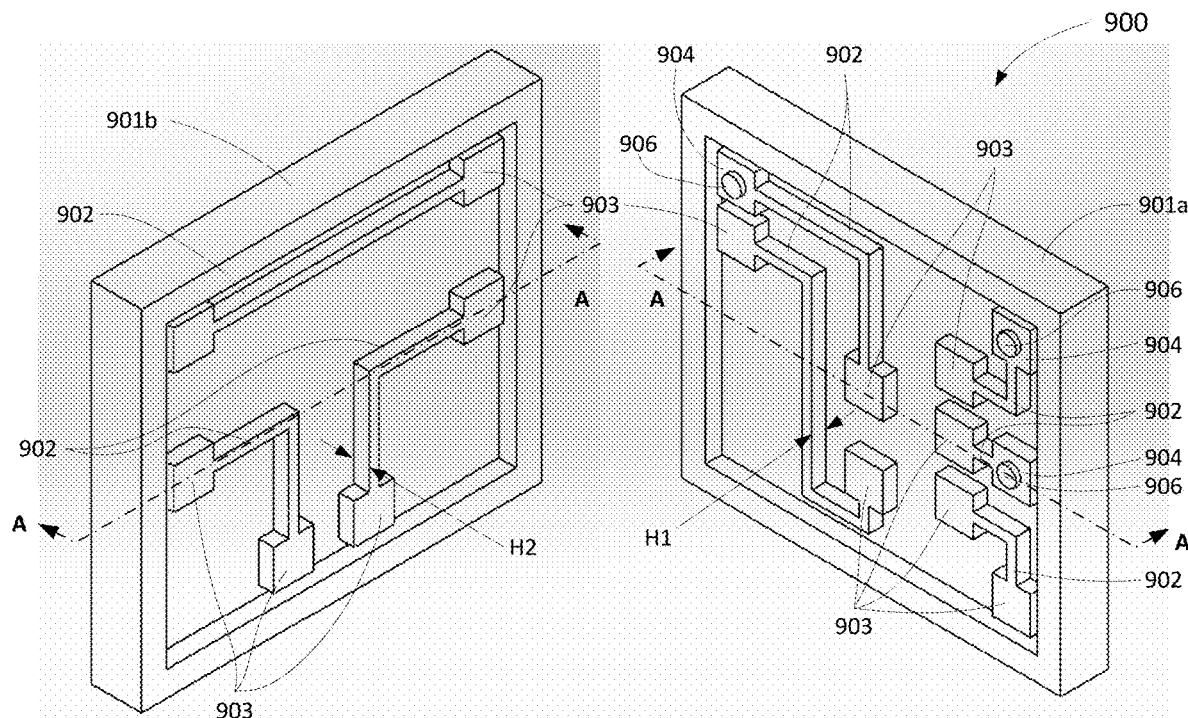
FIG. 6A is a perspective view of an embodiment of a mold to form a two-sided 3D dielectric substrate, and is shown before mold closure.

FIG. 6A shows an embodiment of a clamshell mold 900 that can be used to form the 3D dielectric substrate 800 shown in FIGS. 5A and 5B. The clamshell mold 900 can have two adjoining sections 901a and 901b made of metal such as carbon steel, stainless steel, aluminum, or titanium, for example. It can have ridges 902 that can form the channels 802, and pads 903 that can form pockets 803 in the 3D dielectric substrate 800. The height "H1" of the ridges 902 and pads 903 in section 901a is the same or substantially the same as the thickness "T1" (FIG. 7B) of the conductive traces and pads of the PCB panel 1000). The height "H2" of the ridges 902 and pads 903 in section 901b is the same or substantially the same as the thickness "T2" of the conductive traces and pads of the PCB panel 1000. In some embodiments the heights "H1" and "H2", and corresponding thicknesses "T1" and "T2", can be the same or within 25 µm of each other, and in others they can be different.

Figure 6B:
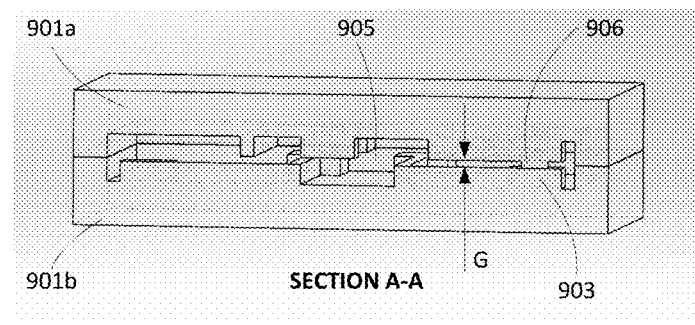
FIG. 6B is a sectional perspective view of an embodiment of the mold depicted in FIG. 6A, taken along the line A-A of FIG. 6A, and is shown closed.

Although FIGS. 6A and 6B depict an embodiment of clamshell mold 900 that corresponds to a two-sided 3D dielectric substrate 800 where the layouts in each side are different, it should be understood that in some embodiments the side layouts can be identical, so the mold sections 901a and 901b would mirror each other. In other embodiments where the 3D dielectric substrate 800 has only one side, the corresponding mold 900 would have ridges and pads on only one section, while the other section can be a flat plate.

Figure 10A:
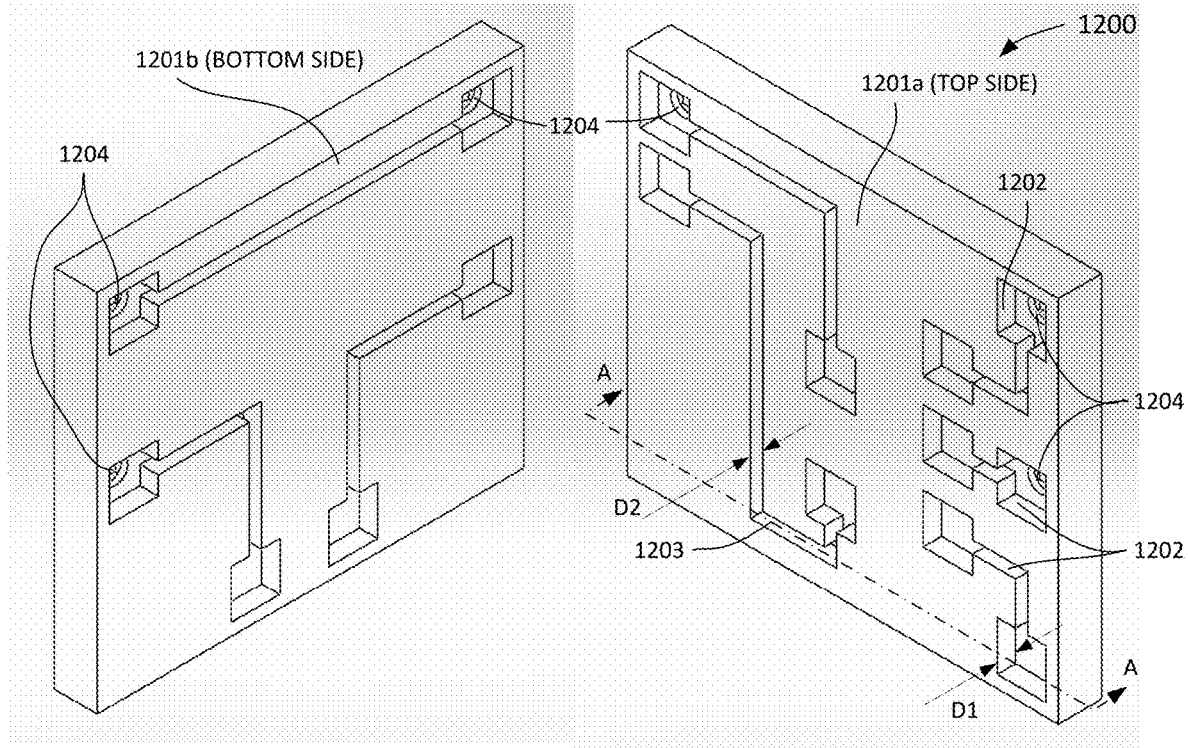
FIG. 10A is a perspective view of an embodiment of a 3D dielectric substrate showing the top and bottom sides.
Figure 10B:
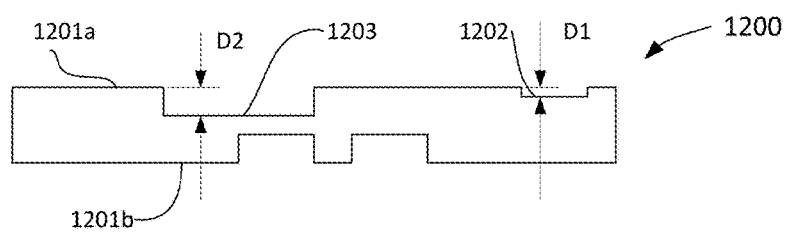
FIG. 10B is a sectional view of an embodiment of the 3D dielectric substrate shown in FIG. 10A, taken along the line A-A in FIG. 10A.

In addition, one section of the mold, section 901a for example, can have pads 904 comprising protruding bosses 906 that abut against pads 903 in the opposite section of the mold, section 901b, for example, so when the mold 900 is closed there is no gap between the boss 906 on pad 904 and the corresponding pad 903, as shown in FIG. 10B, which shows a sectional view of the closed clamshell mold 900. The boss 906 on pads 904 can form the openings 804 in the 3D dielectric substrate 800 shown in FIGS. 5A and 5B.

When the mold 900 is closed (FIG. 6B), its two sections 901a and 901b form a cavity 905 that can be filled with a fiber-reinforced polymer, such as NEMA FR-4 glass epoxy laminate, glass-reinforced polyimide laminate, or ceramic-reinforced polytetrafluorethylene resin based laminate, for example, to form the 3D dielectric substrate 800 shown in FIGS. 5A and 5B. While the mold 900 shown in FIGS. 6A and 6B has three pads 904 with protruding bosses 906, other embodiments can have a different number of pads 904 with bosses 906, or only pads 903 without bosses. As shown in FIG. 6B, the clamshell mold 900 can be built in such way that when it is closed it can have a gap between opposing ridges 902 and/or pads 903 with a width "G" that can be filled with dielectric material. The height of the bosses 906 can be the same or substantially the same as the width "G".

Since pads 904 have bosses 906, there can be no gap between portions of the opposing surfaces of the mold 900 where the pads 906 are located.

In some embodiments, the 3D dielectric substrate 800 can be formed by machining the channels 802, pads 803 and openings 804 in a dielectric plate made of a fiber-reinforced polymer, such as NEMA FR-4 glass epoxy laminate, glass-reinforced polyimide laminate, or ceramic-reinforced polytetrafluorethylene resin based laminate, for example. In those cases, the mold 900 would not be required.

Figure 6C:
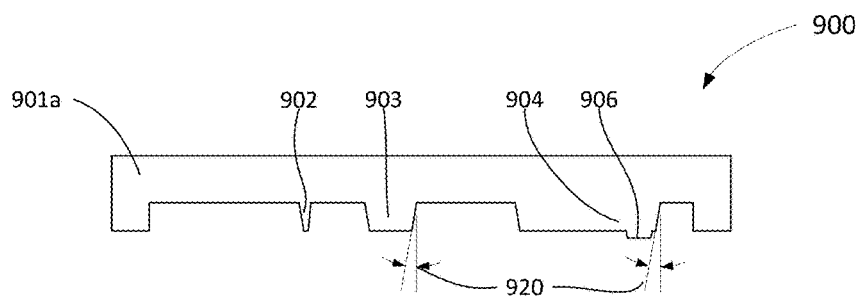
FIG. 6C is a side view of an alternate embodiment of a portion of the mold depicted in FIGS. 6A and 6B.

FIG. 6C shows an alternate embodiment of the mold 900 where the side walls of ridges 902, pads 903 and 904 and bosses 906 can have a draft angle 920, with a range between about 0 degrees and about 5 degrees, to facilitate removing the 3D dielectric substrate 800 from mold 900 after molding step 701 (FIG. 4). The draft angle 920 also can facilitate the electrolytic metallization step 707 (FIG. 4).

Once the 3D dielectric substrate 800 is formed, it can undergo an inspection step 702 (FIG. 4) followed by metallization 703, and then coated with a resist film 704 that can cover the surfaces of sides 801a and 801b (FIGS. 5A-5B) of the 3D dielectric substrate 800, except its channels 802 and pockets 803. The resist can be exposed to UV light and developed (steps 705 and 706). The 3D dielectric substrate 800 then can undergo an electrolytic metallization step 707 where the channels 802 and pads 803 and openings 804 can be completely filled with a highly conductive material 805 (FIGS. 7A-7B), such as copper or aluminum, for example. After electrolytic metallization, the resist can be stripped out from the surfaces of sides 801a and 801b in step 708, followed by a micro-etch step 709 intended to remove the metallization applied in step 703 on the surfaces of sides 801a and 801b. In some cases, the high conductive material applied in the electrolytic metallization step 707 can protrude above the surfaces of sides 801a and 801b (i.e., it can overfill them) of the 3D dielectric substrate 800, which is undesirable because it creates an uneven surface that can cause voids in subsequent lamination steps such as step 712 (FIG. 4), for example. Such voids can weaken the PCB structure and/or hinder thermal conductivity across the PCB layers. A planarization step 710 can take place to make the outer surfaces of the high conductive traces and pads deposited on the 3D substrate flush with the surfaces of sides 801a and 801b.

Figure 7A:
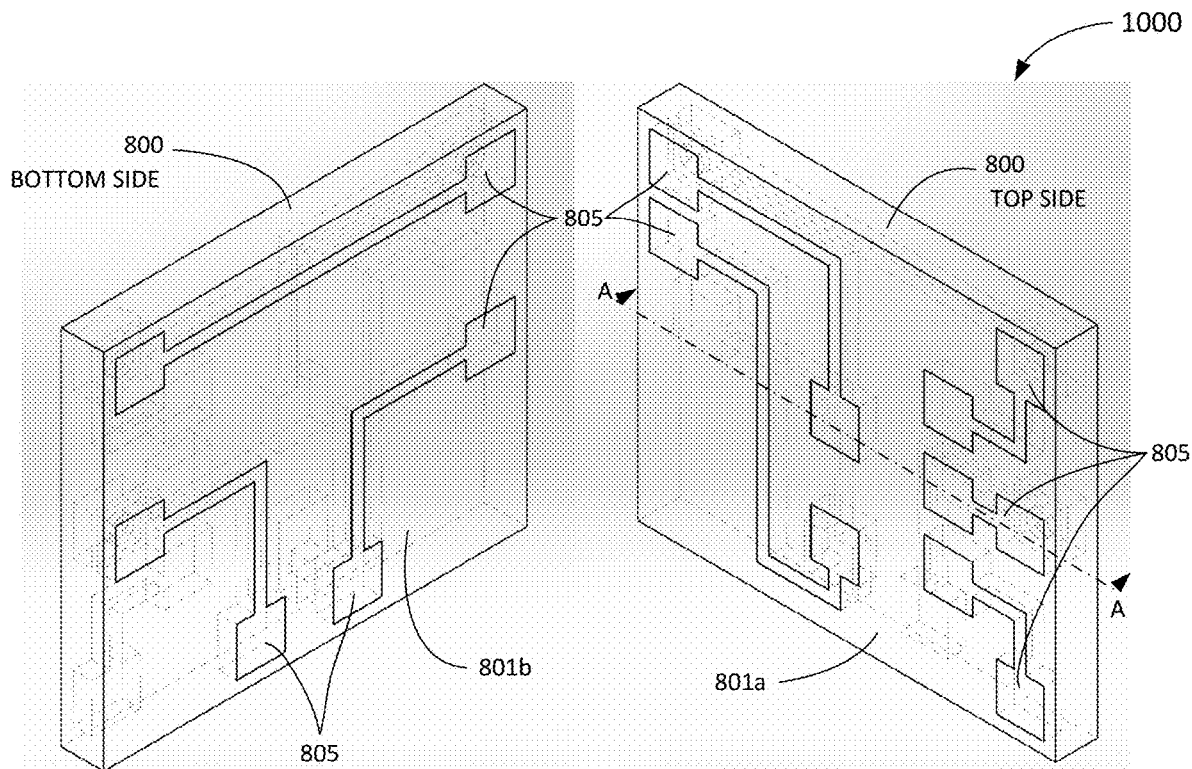
FIG. 7A is a perspective view of an embodiment of a PCB panel showing the top and bottom sides.
Figure 7B:
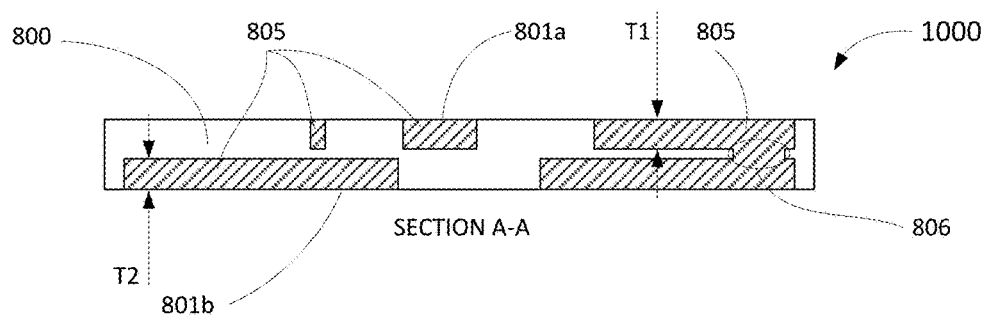
FIG. 7B is a sectional side view of an embodiment of the PCB panel shown in FIG. 7A, taken along the line A-A in FIG. 7A.

The resulting structure after the planarization step 710 (FIG. 4) is a two-layer PCB panel 1000 shown in FIGS. 7A and 7B, where the 3D dielectric substrate 800 has its channels 802 and pockets 803 in sides 801a and 801b (FIGS. 5A and 5B) filled with a highly conductive material 805 (FIGS. 7A and 7B) forming the conductive layers of the PCB panel 1000. The traces and pads 805 that form the conductive layers of PCB panel 1000 are flush with sides 801a and 801b (FIGS. 5A and 5B). FIG. 7B shows a sectional view where the openings 804 (FIGS. 5A and 5B) are filled with the highly conductive material 805 forming a connection 806 between the conductive layers of the PCB panel 1000.

Figure 7C:
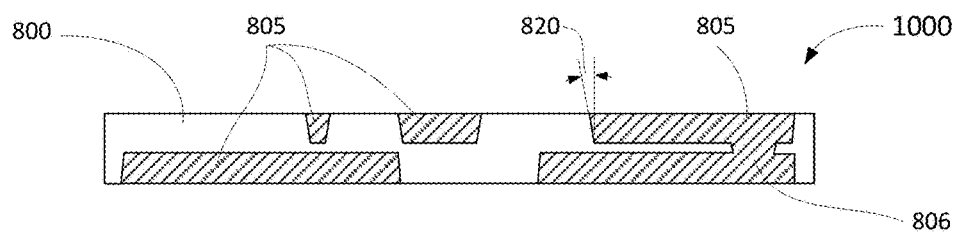
FIG. 7C is a sectional side view of an alternate embodiment of a PCB panel.

FIG. 7C shows an alternate embodiment of the two-layer PCB panel 1000 where the 3D dielectric substrate 800 is formed in a mold 900 (FIGS. 6A-6C) where the side walls of ridges 902, pads 903 and 904 and bosses 906 have a draft angle 920 (FIG. 6C) between about 0 degrees and about 5 degrees. In these embodiments, the channels 802, pockets 803 and openings 804 of the 3D dielectric substrate 800 can have corresponding draft angles 820, and those channels 802, pockets 803 and openings 804 can be completely filled with the highly conductive material 805 during the electrolytic metallization step 707 (FIG. 4).

Figure 8:
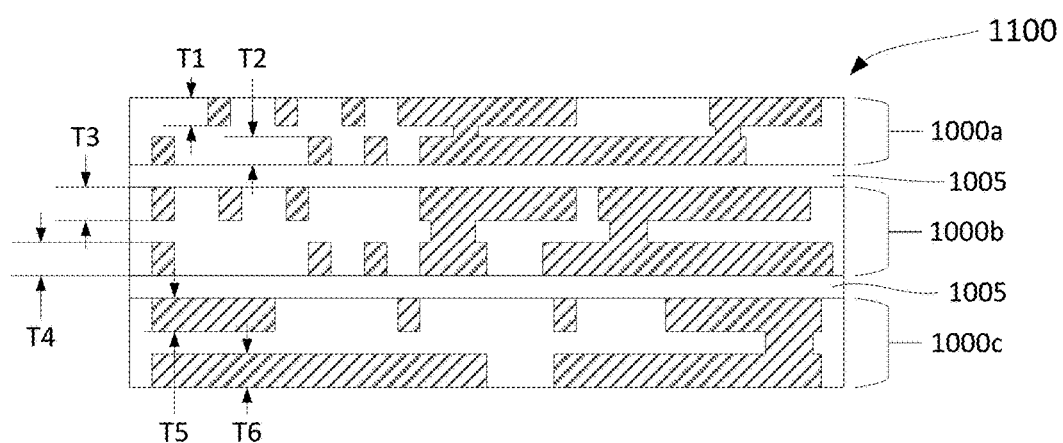
FIG. 8 is a sectional side view of an embodiment of a multi-layer PCB structure.
Figure 9:
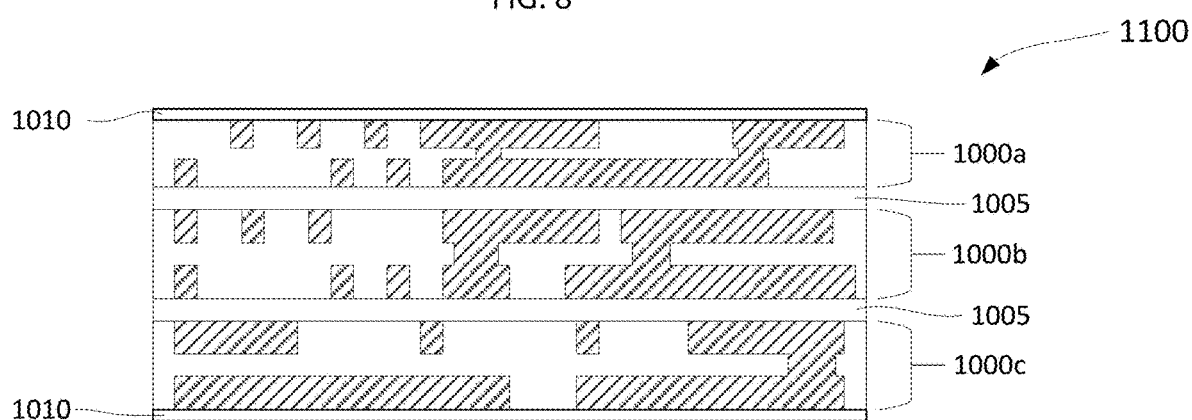
FIG. 9 is a sectional side view of another embodiment of a multi-layer PCB structure.

In some embodiments where the final PCB can have more than two conductive layers, a plurality of PCB panels can be inspected (step 711 in FIG. 4), stacked and laminated together in step 712. FIG. 8 shows an example of a PCB 1100 comprising six conductive layers built with three PCB panels 1000*a*, 1000*b* and 1000*c* interleaved with dielectric layers 1005. The dielectric layers 1005 can be made of a fiber-reinforced polymer, as described herein. The PCB panels 1000*a*, 1000*b* and 1000*c* can have the same or different layouts. For example, the PCB panel 1000*a* can have two layers with thicknesses "T1" and "T2" respectively, PCB panel 1000*b* can have two layers with thicknesses "T3" and "T4" respectively, and PCB panel 1000*c* can have two layers with thicknesses "T5" and "T6".

Embodiments of the PCB 1100 can be built with a combination of two and one-layer PCB panels. Other embodiments can have panels comprising conductive layers having the same thickness. Other embodiments yet can have some or all conductive layers having the same layout. Some embodiments of the PCB 1100 can have a combination of multiple panels with one or two conductive layers, some of the conductive layers can have the same thickness, and/or some of the conductive layers can have the same layout.

After the lamination process 712 (FIG. 4), the PCB structure can undergo via drilling, metallization and plating as per steps 713 through 722. Some embodiments of the PCB 1100 where lamination and via drilling is not required, the PCB 1100 can go from panel inspection (step 711 in FIG. 4) straight to solder mask application, step 723 through 726, and proceed through finishing steps 727 through 732 (FIG. 4). In other embodiments, like the one shown in FIG. 9, the lamination step 712 of the PCB 1100 can include external dielectric layers 1010. In this case, the PCB 1100 would not need application of solder mask, thus undergoing the via drilling, metallization, and plating steps 713 through 722, then going straight to the finishing steps 727 through 732 (FIG. 4).

Some embodiments of the PCB structure can have traces and pads with different thicknesses in the same conductive layer. FIGS. 10A and 10B show an embodiment 1200 of a 3D dielectric substrate were a first side 1201*a*, also referred to as "top side," can have at least one channel and/or pocket 1203 with a depth "D2" different from the depth "D1" of the other channels and/or pockets 1202 in the side 1201*a*. The 3D dielectric structure 1200 can have a second side 1201*b* (also referred to as "bottom side") opposite to the side 1201*a* with its respective channels and pockets, similar to the embodiment depicted in FIGS. 5A and 5B. In that case, the 3D dielectric structure 1200 can have openings 1204 to connect the two sides of the 3D dielectric structure 1200. In some embodiments, the 3D dielectric structure 1200 can have channels and/or pockets 1202, 1203 in only one side, in which case the other side can be flat. Although the embodiment depicted in FIGS. 10A and 10B has channels and/or pockets 1202, 1203 with different depths on one side, it should be understood that other embodiments can have traces and/or pockets with different depths on both sides. Furthermore, some embodiments can have channels and/or pockets with many different depths. The 3D dielectric substrate 1200 can be formed from a fiber-reinforced polymer, as described herein.

Figure 11A:
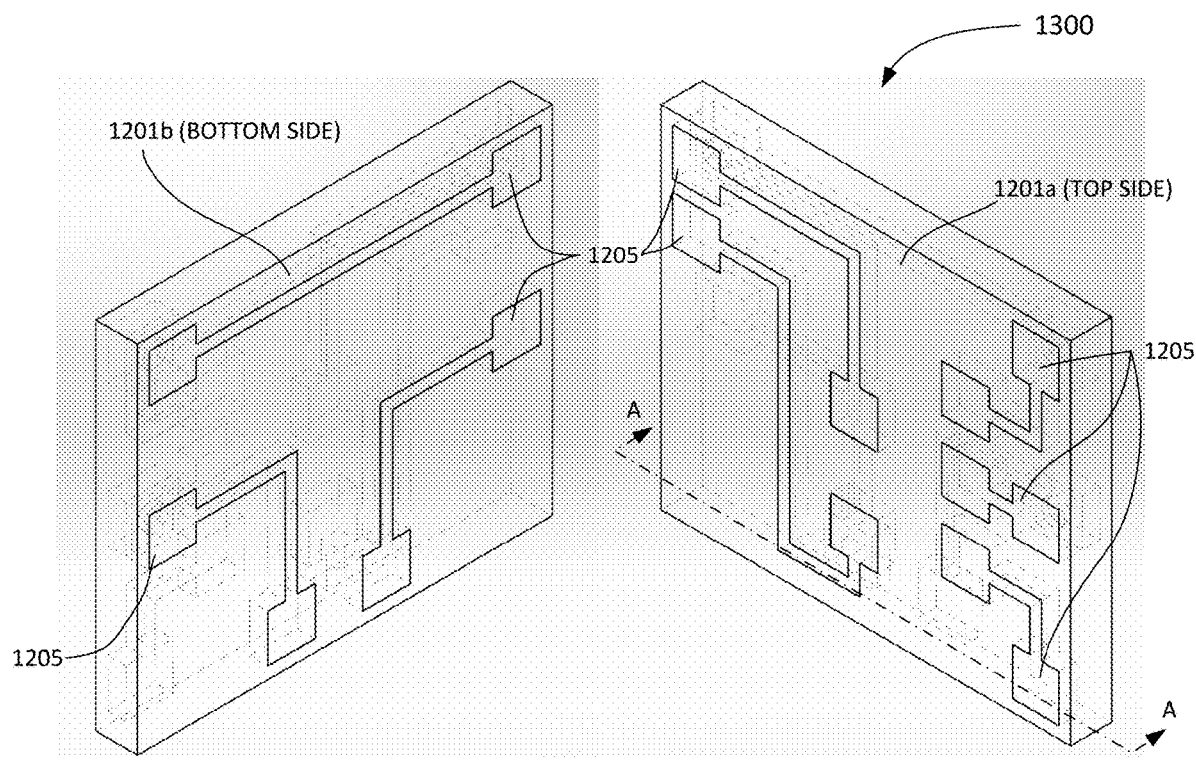
FIG. 11A is a perspective view of an embodiment of a PCB panel showing the top and bottom sides.
Figure 11B:
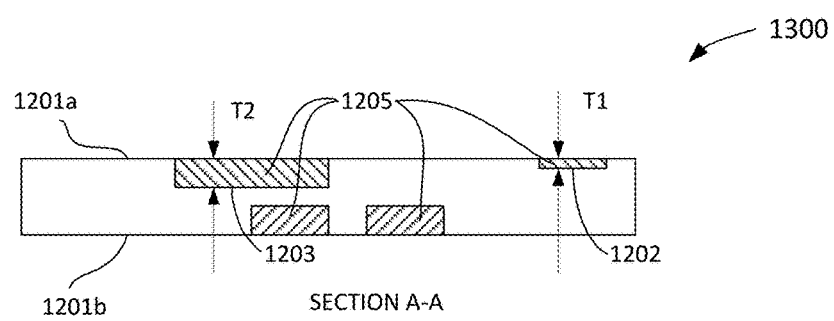
FIG. 11B is a sectional view of an embodiment of the PCB panel shown in FIG. 11A, taken along the line A-A in FIG. 11A.

In the electrolytic metallization step 707 (FIG. 4) the channels and pockets of the 3D dielectric structure 1200 can be completely filled with highly conductive material 1205, such as copper or aluminum, for example, forming conductive layers in a PCB structure 1300. FIGS. 11A and 11B depict a PCB structure 1300 after the planarization step 710 (FIG. 4) where the channels and/or pockets 1202 (FIG. 10A) are filled with the highly conductive material 1205 forming traces and/or pads with thickness "T1" and the channels and/or pockets 1203 are filled with the highly conductive material 1205 forming traces and/or pads with thickness "T2". The thicknesses "T1" and "T2" (FIG. 11B) correspond to the depths "D1" and "D2" (FIG. 10B), respectively, of the 3D dielectric structure 1200. As depicted in FIGS. 11A and 11B, some embodiments of the PCB structure 1300 can have a highly conductive material 1205 deposited on both sides 1201*a* and 1201*b* of the structure. Other versions can have the conductive material deposited on only one side. In all embodiments, the outer surfaces of traces and pads of highly conductive material can be flush with the top (1201*a*) and/or bottom (1201*b*) sides of the PCB structure 1300.

Figure 12:
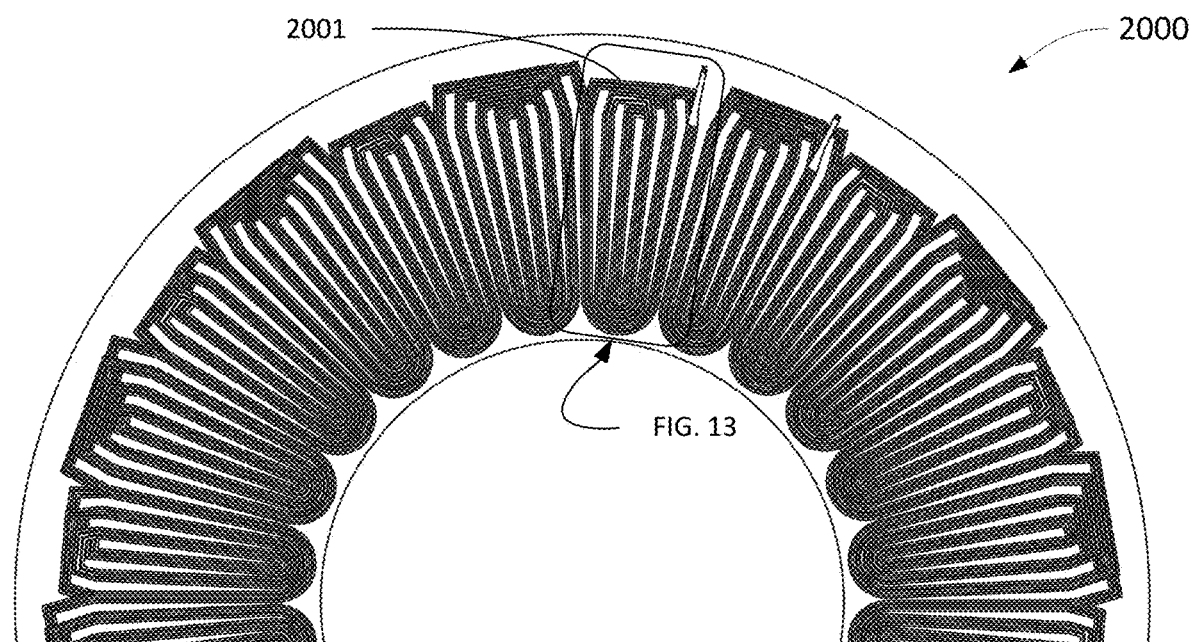
FIG. 12 is a partial top view of an embodiment of a PCB stator.

FIG. 12 shows a partial view of a PCB stator 2000 employed in an axial field rotary energy device similar to the one described in U.S. Pat. Nos. 10,141,803, 10,135,310, 10,340,760, 10,141,804, 10,186,922, and 11,502,583, for example. The PCB stator 1200 can have a plurality of conductive layers and each conductive layer can have a plurality of coils 2001.

Figure 13:
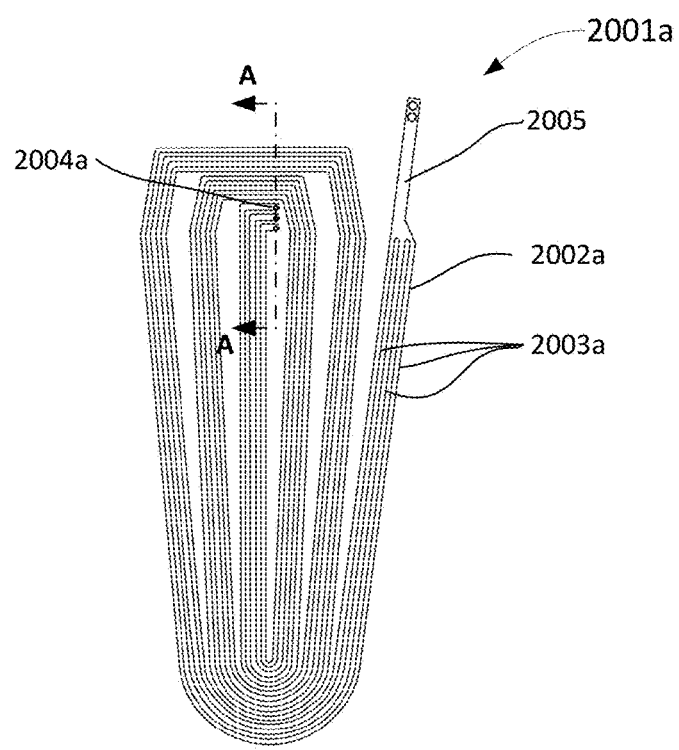
FIG. 13 is a top view of an embodiment of a coil for a PCB stator, as noted in FIG. 12.

FIG. 13 shows an isolated coil 2001 of PCB stator 2000. Hereinafter, coil 2001 can be referred to as coil 2001*a*. Although coil 2001*a* shown in FIG. 13 has three turns 2002*a* and each turn 2002*a* has three traces 2003*a* in parallel, other embodiments of the PCB stator 2000 can have coils 2001*a* with 1, 2, 4 or more turns, and each turn in those embodiments can have 1, 2, 4 or more traces in parallel. Each of the traces 2003*a* in coil 2001*a* can be terminated in a pad 2004*a*, or can merge with other traces to form a terminal 2005 that can be connected to another PCB stator or to a power supply. Although FIG. 13 shows a coil 2001*a* with a terminal 2005, other embodiments of coil 2001*a* can have traces 2003*a* terminated in pads 2004*a* at both ends of each trace 2003*a*. Pad 2004*a* can be connected to another pad in another coil located in another layer of the PCB stator 2000, in some examples.

Figure 14:
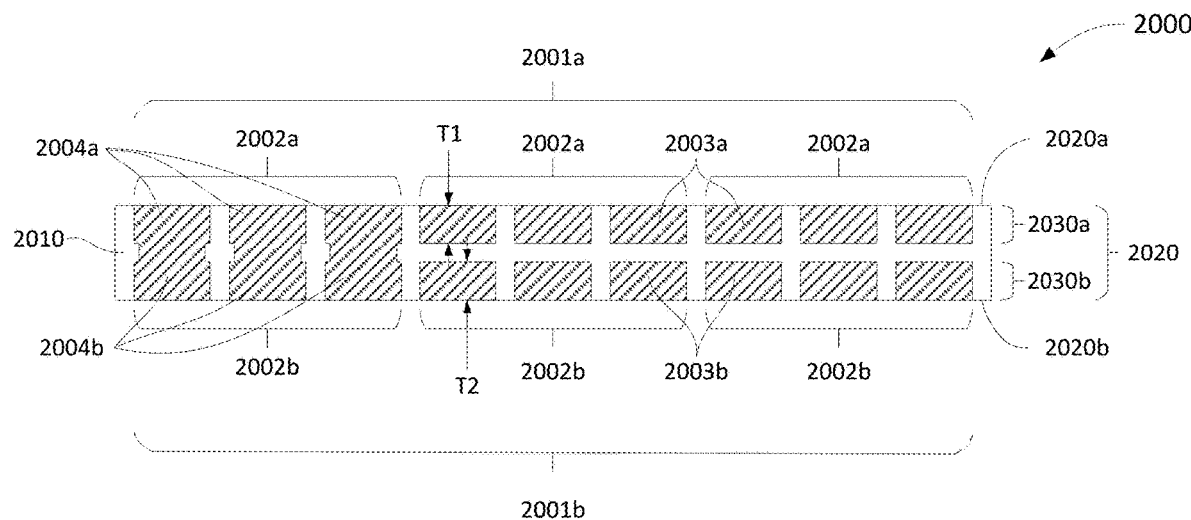
FIG. 14 is a sectional side view of an embodiment of a PCB stator coil, taken along the line A-A of FIG. 13.

FIG. 14 depicts a sectional side view A-A of PCB stator 2000 showing coil 2001*a* with its turns 2002*a*, traces 2003*a*, and pads 2004*a* located in a layer 2030*a* and an adjacent coil 2001*b* located in a different layer 2030*b* of the PCB stator 2000. Coil 2001*b* can have turns 2002*b* and pads 2004*b*. Each turn of coil 2001*b* can have traces 2003*b*. The pads 2004*a* and 2004*b* of coils 2001*a* and 2001*b*, respectively, can be interconnected. Although FIG. 14 shows a coil 2001*b* substantially similar to coil 2001*a* having three turns 2002*b* and each turn having three traces 2003*b* in parallel, other embodiments of the PCB stator 2000 can have coils 2001*b* with any number of turns and any number of traces in parallel. Moreover, some embodiments of the PCB stator 2000 can have coils 2001*a* and 2002*b* with different numbers of turns, respectively. In the embodiment shown in FIG. 14, layers 2030*a*, b can be formed in the same 3D dielectric substrate 2010, which together with the conductive traces 2003*a* and 2003*b* form a PCB panel 2020. The PCB panel 2020 can be formed by completely filling the channels and pockets of the 3D dielectric substrate 2010 with a highly conductive material in a electrolytic metallization step 707, as described in the process 700 shown in FIG. 4. The PCB panel 2020 can undergo a planarization step 710 to make the outer surfaces of the highly conductive traces 2003*a* and 2003*b* and pads 2004*a* and 2004*b* flush with the surfaces 2020*a* and 2020*b* of the PCB panel 2020.

In the PCB stator 2000 embodiment shown in FIG. 14, the thickness "T1" of layer 2030a and thickness "T2" of layer 2030b are the same or substantially the same. In other embodiments, however, the thicknesses "T1" and "T2" can be different.

Figure 15:
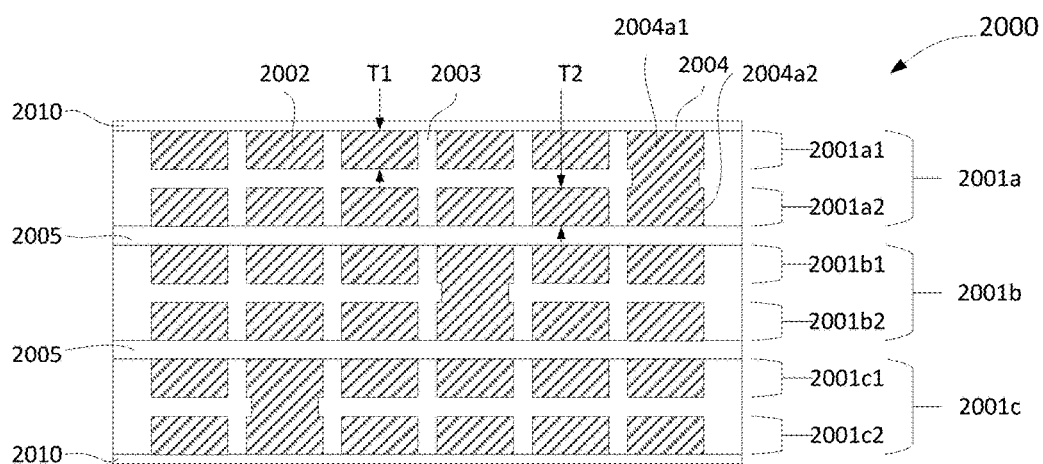
FIG. 15 is a sectional side view of another embodiment of a PCB stator.

Embodiments of the PCB stator 2000 can have a plurality of PCB panels 2020 connected in parallel and/or assigned to different electrical phases. The example of a PCB stator 2000 shown in FIG. 15 depicts a sectional side view of a 3-phase PCB stator 2000 with three panels, where each panel 2001a, 2001b, and 2001c can be assigned to a respective electrical phase. The 3-phase PCB stator 2000 shown in FIG. 15 can be used in an axial field rotary energy device. The PCB stator 2000 can have three, two-layer panels 2001a, 2001b and 2001c laminated together with interleaved layers of a dielectric material 2005 and with external dielectric layers 2010. As an example, panel 2001a has layers 2001a1 and 2001a2. Each panel 2001a-2001c can be formed by depositing an electrically conductive material 2002 (e.g., step 707 in process 700 shown in FIG. 4), such as copper, for example, into the channels and pockets formed in a 3D dielectric substrate 2003. Some pockets 2004 can be interconnected to a corresponding pocket in the other layer of the PCB panel 2020. As an example, pocket 2004a1 in layer 2001a1 of panel 2001a is connected to pocket 2004a2 of layer 2001a2 of the same panel 2001a. In the embodiment depicted in FIG. 15, the thickness of the two layers in each panel can be the same. As an example, the thickness "T1" of layer 2001a1 of panel 2001a is the same or substantially the same as thickness "T2" of layer 2001a2 of the same panel 2001a, and the thicknesses of the layers 2001b1, 2001b2, 2001c1 and 2001c2 of the panels 2001b and 2001c, respectively, can be the same or substantially the same as "T1" or "T2". However, other embodiments may have different thicknesses "T1" and "T2" or can have different thicknesses in each one of the layers of each panel. Some embodiments of PCB stator 2000 can have more than one PCB panel (e.g., 2001a, 2001b and 2001c) assigned to each corresponding phase, and other embodiments of PCB stator 2000 can have 1, 2 or more than 3 phases with a plurality of PCB panels assigned to each phase.

Other embodiments can include one or more of the following items.

1. A printed circuit board (PCB), comprising:
a tridimensional (3D) dielectric substrate having opposite sides and made of fiber-reinforced polymer;
each side comprises channels and pockets formed by molding a dielectric laminate, and the channels and pockets define a layout for conductive traces and pads of the PCB;
the channels and pockets in a same side of the 3D dielectric substrate have a uniform depth;
side walls of the channels and pockets have a draft angle in a range of greater than 0 degrees to about 5 degrees;
the conductive traces and pads are formed into the channels and pockets by electrolytic metallization; and
the outer surface of conductive traces and pads are flush with the sides of the 3D dielectric substrate.

2. The PCB wherein the channels and pockets of a first side of the sides of the 3D dielectric substrate have a first depth, the channels and pockets of a second side of the sides of the 3D dielectric substrate have a second depth.

3. The PCB wherein the first and second depths are the same or within 25 μm of each other.

4. The PCB wherein the sides have a same layout.

5. The PCB wherein each side has a different layout.

6. The PCB wherein the first depth differs from the second depth.

7. The PCB wherein the sides have a same layout.

8. The PCB wherein each side has a different layout.

9. The PCB further comprising a plurality of 3D dielectric substrates, wherein each side of the 3D dielectric substrates has a different layout.

10. The PCB wherein the channels and pockets in each side have a different depth from those in another side.

11. The PCB wherein the uniform depth of the channels and pockets is equal to or greater than 140 μm.

12. A printed circuit board (PCB), comprising:
a tridimensional (3D) fiber-reinforced polymer dielectric substrate having opposite sides;
each side comprises channels and pockets formed by molding a dielectric laminate, and the channels and pockets define a layout for conductive traces and pads of the PCB;
the channels and pockets in a same side of the 3D dielectric substrate have non-uniform depths;
side walls of the channels and pockets have a draft angle in a range of greater than 0 degrees to about 5 degrees;
the conductive traces and pads are formed into the channels and pockets by electrolytic metallization; and
the outer surface of conductive traces and pads are flush with the sides of the 3D dielectric substrate.

13. A printed circuit board (PCB) stator for an axial field rotary energy device, the PCB stator comprising:
PCB panels, each comprising a tridimensional (3D) dielectric substrate with opposite sides and made of fiber-reinforced polymer;
each side comprises channels and pockets comprising molded dielectric laminate, the channels and pockets in each side have a uniform depth, and the channels and pockets comprise a layout of conductive traces and pads that are plated therein and the outer surface of those conductive traces and pads are flush with the sides of the 3D dielectric substrate; and
side walls of the channels and pockets have a draft angle in a range of greater than 0 degrees to about 5 degrees.

14. The PCB stator wherein the channels and pockets of a first side of the sides of the PCB panels have a first depth, the channels and pockets of a second side of the sides of the PCB panels have a second depth.

15. The PCB stator wherein the first and second depths are the same or within 25 μm of each other.

16. The PCB stator wherein the sides of each PCB panel have a same layout.

17. The PCB stator wherein the sides of each PCB panel have a different layout.

18. The PCB stator wherein the first depth differs from the second depth.

19. The PCB stator wherein the sides of each PCB panel have a same layout.

20. The PCB stator wherein the sides of each PCB panel have a different layout.

21. The PCB stator wherein the uniform depth of the channels and pockets is equal to or greater than 140 μm.

22. A method of manufacturing a printed circuit board (PCB), the method comprising:
forming a tridimensional (3D) dielectric substrate on a fiber-reinforced polymer with opposite sides;
forming each side with channels and pockets by molding dielectric laminate, and the channels and pockets define a layout for conductive traces and pads of the PCB;
forming the channels and pockets in a same side of the 3D dielectric substrate at a uniform depth;
forming side walls of the channels and pockets of the 3D dielectric substrate with a draft angle in a range of greater than 0 degrees to about 5 degrees;

depositing by electrolytic metallization the conductive traces and pads into the channels and pockets of the 3D dielectric substrate; and the outer surface of those conductive traces and pads are flush with the sides of the 3D dielectric substrate.

23. The method wherein the channels and pockets of a first side of the sides comprise a first depth, and the channels and pockets of a second side of the sides comprise a second depth.

24. The method wherein the first and second depths are the same or within 25 μm of each other.

25. The method wherein the sides of the 3D dielectric substrate are formed with a same layout.

26. The method wherein each side of the 3D dielectric substrate is formed with a different layout.

27. The method wherein the first depth differs from the second depth.

28. The method wherein the sides of the 3D dielectric substrate are formed with a same layout.

29. The method wherein each side of the 3D dielectric substrate is formed with a different layout.

30 A method of manufacturing a printed circuit board (PCB), the method comprising:

forming a tridimensional (3D) fiber-reinforced polymer dielectric substrate with opposite sides;

forming each side with channels and pockets by molding dielectric laminate, and the channels and pockets define a layout for conductive traces and pads of the PCB;

forming the channels and pockets in a same side of the 3D dielectric substrate with non-uniform depths;

forming side walls of the channels and pockets of the 3D dielectric substrate with a draft angle in a range of greater than 0 degrees to about 5 degrees; and depositing by electrolytic metallization the conductive traces and pads into the channels and pockets of the 3D dielectric substrate; and the outer surface of those conductive traces and pads are flush with the sides of the 3D dielectric substrate.

31. A method of manufacturing a printed circuit board (PCB) stator for an axial field rotary energy device, the method comprising:

forming a PCB panel as a tridimensional (3D) fiber-reinforced polymer dielectric substrate with opposite sides;

each side comprises channels and pockets formed by molding dielectric laminate, and the channels and pockets define a layout for conductive traces and pads of the PCB stator;

the channels and pockets in a same side of the 3D dielectric substrate have a uniform depth;

side walls of the channels and pockets of the 3D dielectric substrate have a draft angle in a range of greater than 0 degrees to about 5 degrees; and depositing by electrolytic metallization and forming the conductive traces and pads into the channels and pockets of the 3D dielectric substrate; and the outer surface of those conductive traces and pads are flush with the sides of the 3D dielectric substrate.

32. The method wherein the channels and pockets of a first side of the sides of the 3D dielectric substrate are formed at a first depth, and the channels and pockets of a second side of the sides of the 3D dielectric substrate are formed at a second depth.

33. The method wherein the first and second depths are the same or within 25 μm of each other.

34. The method wherein the first depth differs from the second depth.

35. The method wherein the channels and pockets are formed with the uniform depth equal to or greater than 140 μm.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom," and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated degrees or at other orientations) and the spatially relative descriptions used herein interpreted accordingly.

This written description uses examples to disclose the embodiments, including the best mode, and also to enable those of ordinary skill in the art to make and use the invention. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

It can be advantageous to set forth definitions of certain words and phrases used throughout this patent document. The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, can mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items can be used, and only one item in the list can be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Also, the use of "a" or "an" is employed to describe elements and components described herein. This is done merely for convenience and to give a general sense of the scope of the invention. This description should be read to include one or at least one and the singular also includes the plural unless it states otherwise.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function.

Benefits, other advantages, and solutions to problems have been described above with regard to specific embodiments. However, the benefits, advantages, solutions to problems, and any feature(s) that can cause any benefit, advantage, or solution to occur or become more pronounced are not to be construed as a critical, required, sacrosanct or an essential feature of any or all the claims.

After reading the specification, skilled artisans will appreciate that certain features which are, for clarity, described herein in the context of separate embodiments, can also be provided in combination in a single embodiment. Conversely, various features that are, for brevity, described in the context of a single embodiment, can also be provided separately or in any subcombination. Further, references to values stated in ranges include each and every value within that range.

What is claimed is:

1. A printed circuit board (PCB), comprising:
   a tridimensional (3D) dielectric substrate having opposite sides and made of fiber-reinforced polymer;
   each side comprises channels and pockets formed by molding a dielectric laminate, and the channels and pockets define a layout for conductive traces and pads of the PCB;
   the channels and pockets in a same side of the 3D dielectric substrate have a uniform depth;
   side walls of the channels and pockets have a draft angle in a range of greater than 0 degrees to about 5 degrees;
   the conductive traces and pads are formed into the channels and pockets by electrolytic metallization; and
   the outer surface of conductive traces and pads are flush with the sides of the 3D dielectric substrate.

2. The PCB of claim 1, wherein the channels and pockets of a first side of the sides of the 3D dielectric substrate have a first depth, the channels and pockets of a second side of the sides of the 3D dielectric substrate have a second depth.

3. The PCB of claim 2, wherein the first and second depths are the same or within 25 µm of each other.

4. The PCB of claim 3, wherein the sides have a same layout.

5. The PCB of claim 3, wherein each side has a different layout.

6. The PCB of claim 2, wherein the first depth differs from the second depth.

7. The PCB of claim 6, wherein the sides have a same layout.

8. The PCB of claim 6, wherein each side has a different layout.

9. The PCB of claim 1, further comprising a plurality of 3D dielectric substrates, wherein each side of the 3D dielectric substrates has a different layout.

10. The PCB of claim 9, wherein the channels and pockets in each side have a different depth from those in another side.

11. The PCB of claim 1, wherein the uniform depth of the channels and pockets is equal to or greater than 140 µm.

12. A printed circuit board (PCB), comprising:
   a tridimensional (3D) fiber-reinforced polymer dielectric substrate having opposite sides;

each side comprises channels and pockets formed by molding a dielectric laminate, and the channels and pockets define a layout for conductive traces and pads of the PCB;

the channels and pockets in a same side of the 3D dielectric substrate have non-uniform depths;

side walls of the channels and pockets have a draft angle in a range of greater than 0 degrees to about 5 degrees;

the conductive traces and pads are formed into the channels and pockets by electrolytic metallization; and the outer surface of conductive traces and pads are flush with the sides of the 3D dielectric substrate.

13. A printed circuit board (PCB) stator for an axial field rotary energy device, the PCB stator comprising:

PCB panels, each comprising a tridimensional (3D) dielectric substrate with opposite sides and made of fiber-reinforced polymer;

each side comprises channels and pockets comprising molded dielectric laminate, the channels and pockets in each side have a uniform depth, and the channels and pockets comprise a layout of conductive traces and pads that are plated therein and the outer surface of those conductive traces and pads are flush with the sides of the 3D dielectric substrate; and side walls of the channels and pockets have a draft angle in a range of greater than 0 degrees to about 5 degrees.

14. The PCB stator of claim 13, wherein the channels and pockets of a first side of the sides of the PCB panels have a first depth, the channels and pockets of a second side of the sides of the PCB panels have a second depth.

15. The PCB stator of claim 14, wherein the first and second depths are the same or within 25 μm of each other.

16. The PCB stator of claim 15, wherein the sides of each PCB panel have a same layout.

17. The PCB stator of claim 15, wherein the sides of each PCB panel have a different layout.

18. The PCB stator of claim 14, wherein the first depth differs from the second depth.

19. The PCB stator of claim 18, wherein the sides of each PCB panel have a same layout.

20. The PCB stator of claim 18, wherein the sides of each PCB panel have a different layout.

21. The PCB stator of claim 13, wherein the uniform depth of the channels and pockets is equal to or greater than 140 μm.

* * * * *